United States Patent
Wei et al.

(10) Patent No.: US 10,359,939 B2
(45) Date of Patent: Jul. 23, 2019

(54) DATA OBJECT PROCESSING METHOD AND APPARATUS

(71) Applicant: Huawei Technologies Co., Ltd., Shenzhen (CN)

(72) Inventors: Jiansheng Wei, Shenzhen (CN); Junhua Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 339 days.

(21) Appl. No.: 14/801,421

(22) Filed: Jul. 16, 2015

(65) Prior Publication Data

US 2017/0017407 A1    Jan. 19, 2017

Related U.S. Application Data

(63) Continuation of application No. PCT/CN2013/081757, filed on Aug. 19, 2013.

(51) Int. Cl.
G06F 12/00 (2006.01)
G06F 3/06 (2006.01)
G06F 12/02 (2006.01)

(52) U.S. Cl.
CPC ............ G06F 3/0608 (2013.01); G06F 3/068 (2013.01); G06F 3/0641 (2013.01); G06F 12/023 (2013.01); G06F 2212/1044 (2013.01)

(58) Field of Classification Search
CPC ......... G06F 17/30159; G06F 17/30153; G06F 3/0608; G06F 12/023; G06F 3/0641; G06F 3/068; G06F 2212/1044
See application file for complete search history.

(56) References Cited

U.S. PATENT DOCUMENTS 5,430,556 A    7/1995   Ito
5,870,036 A    2/1999   Franaszek et al.
(Continued)

FOREIGN PATENT DOCUMENTS

CN    101706825 A    5/2010
JP    2000105839 A    4/2000
(Continued)

OTHER PUBLICATIONS

Xuejun Nie et al., "Optimization for data de-duplication algorithm based on file content", Frontiers of Optoelectronics in China, Jul. 21, 2010, total 10 pages.
(Continued)

*Primary Examiner* — Arvind Talukdar
(74) *Attorney, Agent, or Firm* — Leydig, Voit & Mayer, Ltd.

(57) ABSTRACT

Embodiments of the present invention provide a data object processing method and apparatus, which can divide a data object into one or more blocks; calculate a sample compression ratio of each block, aggregate neighboring consecutive blocks with a same sample compression ratio characteristic into one data segment, and obtain the sample compression ratio of each of the data segments; and select, according to a length range to which a length of each of the data segments belongs and a compression ratio range to which the sample compression ratio of each of the data segments belongs, an expected length to divide the data segment into data chunks, where the sample compression ratio of each of the data segments uniquely belongs to one of the compression ratio ranges, and the length of each of the data segments uniquely belongs to one of the length ranges.

16 Claims, 6 Drawing Sheets

(56) References Cited

U.S. PATENT DOCUMENTS

| | | |
|---|---|---|
| 6,243,081 B1 | 6/2001 | Goris et al. |
| 6,501,796 B1 | 12/2002 | Dusseux et al. |
| 7,269,689 B2 | 9/2007 | Eshghi et al. |
| 7,519,274 B2 | 4/2009 | Li |
| 7,519,635 B1 | 4/2009 | Haustein et al. |
| 7,814,284 B1 * | 10/2010 | Glass .............. H03M 7/30 704/258 |
| 7,925,683 B2 | 4/2011 | Jain et al. |
| 8,108,353 B2 | 1/2012 | Balachandran et al. |
| 8,140,491 B2 | 3/2012 | Mandagere et al. |
| 8,214,517 B2 | 7/2012 | Dubnicki et al. |
| 8,427,346 B2 | 4/2013 | Potkonjak |
| 8,433,823 B2 | 4/2013 | Hugly et al. |
| 8,645,333 B2 | 2/2014 | Balachandran et al. |
| 2007/0058874 A1 | 3/2007 | Tabata et al. |
| 2008/0098083 A1 | 4/2008 | Shergill et al. |
| 2008/0133561 A1 * | 6/2008 | Dubnicki ............ G06F 11/1453 |
| 2012/0311188 A1 | 12/2012 | Li et al. |
| 2012/0317333 A1 | 12/2012 | Yamamoto et al. |
| 2013/0005454 A1 | 1/2013 | Amaitis et al. |
| 2013/0198148 A1 | 8/2013 | Chambliss et al. |
| 2013/0212074 A1 | 8/2013 | Romanski et al. |
| 2014/0095439 A1 * | 4/2014 | Ram ................ G06F 17/30159 707/640 |
| 2015/0142755 A1 | 5/2015 | Kishi |
| 2015/0363438 A1 * | 12/2015 | Botelho ............ G06F 11/1456 707/692 |
| 2016/0253105 A1 * | 9/2016 | Chang ................ G06F 3/0608 711/154 |

FOREIGN PATENT DOCUMENTS

| | | |
|---|---|---|
| JP | 2007082235 A | 3/2007 |
| JP | 2010515114 A | 5/2010 |
| JP | 2012164130 A | 8/2012 |
| JP | 2013514558 A | 4/2013 |
| KR | 20070089462 A | 8/2007 |
| RU | 2209527 C2 | 7/2003 |
| RU | 2467499 C2 | 11/2012 |
| WO | 2008070484 A2 | 6/2008 |
| WO | 2011092047 A1 | 8/2011 |
| WO | 2014030252 A1 | 2/2014 |

OTHER PUBLICATIONS

Ahmed El-Shimi et al., "Primary Data Deduplication—Large Scale Study and System Design", Microsoft Corporation, Apr. 11, 2013, total 12 pages.

Woojoong Lee et al., "An Adaptive Chunking Method for Personal Data Backup and Sharing", Proceedings of the 8th USENIX conference on File and storage technologies post session, 2010, total 2 pages.

Erik Kruus et al., "Bimodal Content Defined Chunking for Backup Streams", FAST 2010, pp. 239-252.

Chuanyi Liu et al., "ADMAD: Application-Driven Metadata Aware De-duplication Archival Storage System", Storage Network Architecture and Parallel I/Os, 2008. SNAPI'08. Fifth IEEE International Workshop on. IEEE, 2008, pp. 29-35.

Guanlin Lu et al., "Frequency Based Chunking for Data De-Duplication", Modeling, Analysis & Simulation of Computer and Telecommunication Systems (MASCOTS), 2010 IEEE International Symposium on. IEEE, 2010 pp. 287-296.

Dirk et al."File Recipe Compression in Data Deduplication Systems," Johannes Gutenberg Universitat Mainz, pp. 1-14, XP55507473 (2013).

* cited by examiner

DATA OBJECT PROCESSING METHOD AND APPARATUS

CROSS-REFERENCE TO RELATED APPLICATIONS

This application is a continuation of International Application No. PCT/CN2013/081757, filed on Aug. 19, 2013, which is hereby incorporated by reference in its entirety.

TECHNICAL FIELD

The present invention relates to the field of information technologies, and in particular, to a data object processing method and apparatus.

BACKGROUND

Data deduplication (Data Deduplication), also known as duplicate data elimination (Duplicate Data Elimination), is a process of identifying and eliminating duplicate content in a data set or a data stream to improve the efficiency of data storage and/or data transmission, and is called deduplication or duplicate elimination for short. Generally, in a deduplication technology, a data set or a data stream is divided into a series of data units, and retains only one data unit that is duplicate, thereby reducing a space cost in a data storage process or bandwidth consumption in a data transmission process.

How to divide a data object into data units where duplicate content can be easily identified is a key issue that needs to be solved. After a data object is divided into data units, a hash value h(•) of a data chunk may be calculated as a fingerprint, and the data units with a same fingerprint are defined as duplicate data. In the prior art, a commonly used data unit for deduplication includes a file, a fixed-length block (Block), a content-defined variable-length chunk (Chunk), and the like. A content defined chunking (Content Defined Chunking, CDC) method adopts a sliding window to scan data and identify a byte string that complies with a preset characteristic, and to mark a position of the byte string as a chunk boundary, so as to divide a data set or a data stream into variable-length chunk sequences. In the method, a chunk boundary is selected based on a content characteristic of data, and can more acutely identify a data unit shared by similar files or data streams, and therefore, the method is widely applied in various data deduplication solutions. According to a research, when the content defined chunking method is adopted to divide a data set or a data stream, a finer chunking granularity means a higher probability of identifying duplicate data and a better deduplication result. However, a finer chunking granularity means a larger number of chunks to be divided from a given data set, thereby increasing an indexing overhead and the complexity of searching for duplicate data. As a result, the time efficiency of data deduplication is reduced.

An expected length is a key parameter for a content defined chunking (Content Defined Chunking, CDC) method to control the chunking granularity. Generally, a CDC method outputs a variable-length chunk sequence for a specific data object, where lengths of various chunks are statistically subject to normal distribution, and the expected length is used to adjust an average value of the normal distribution. Generally, the average value of the normal distribution is represented by an average chunk length. Because a random variable is assigned an average value at a highest probability under the normal distribution, the average chunk length is also called a peak length and may equal the expected length in an ideal circumstance. For example, in the CDC method, a fingerprint f(w-bytes) of data within a sliding window is calculated in real time. When certain bits of the f(w-bytes) match a preset value, a position of the sliding window is selected as a chunk boundary. Because an update of data content may result in a random change of a hash fingerprint, if f(w-bytes) & 0xFFF=0 is set as a match condition, where & is a bit-AND operation in a binary field, and 0xFFF is a hexadecimal expression of 4095, one fingerprint match may theoretically occur in 4096 random changes of f(w-bytes), that is, a chunk boundary can be found each time the sliding window slides 4 KB (4096 bytes) forward. The chunk length under an ideal circumstance is an expected chunk length (Expected Chunk Length) in the CDC method, and is called an expected length for short.

To reduce the number of chunks as much as possible while maintaining the space efficiency of deduplication, the prior art provides a content defined bimodal chunking method. The core idea of the content defined bimodal chunking method is to adopt a variable-length chunking mode with two different expected lengths: when dividing a file into data chunks, determine duplication of candidate chunks by querying a deduplication storage system, and adopt a small-chunk mode in a region of transition between duplicate data and non-duplicate data and a large-chunk mode in a non-transitional region.

However, the technology cannot work independently, and when determining how to chunk a data object, a chunk computing device needs to frequently query the fingerprint of a data chunk existing in a deduplication storage device, where the deduplication storage device stores a data chunk where data deduplication has been performed, determine, according to the duplication of candidate chunks, whether there is a region of transition between the duplicate data and the non-duplicate data, and then determine which chunking mode is adopted finally. Therefore, the prior art causes query load pressure to the deduplication storage device.

SUMMARY

Embodiments of the present invention provide a data object processing technology, which can divide a data object into data chunks.

According to a first aspect, an embodiment of the present invention provides a data object processing method, where the method includes: dividing a data object into one or more blocks; calculating a sample compression ratio of each block, aggregating consecutive blocks with a same sample compression ratio characteristic into one data segment, and obtaining the sample compression ratio of each of the data segments; selecting, according to a length range to which a length of each of the data segments belongs and a compression ratio range to which the sample compression ratio of each of the data segments belongs, an expected length to divide the data segment into data chunks, where the sample compression ratio of each of the data segments uniquely belongs to one of the compression ratio ranges, and the length of each of the data segments uniquely belongs to one of the length ranges.

According to a second aspect, an embodiment of the present invention provides a data object processing apparatus, where the apparatus includes: a block dividing module, configured to divide a data object into one or more blocks; a data segment generating module, configured to calculate a sample compression ratio of each block, aggregate consecutive blocks with a same sample compression ratio characteristic into one data segment, and obtain the sample compression ratio of each of the data segments; and a data chunk generating module, configured to select, according to a length range to which a length of each of the data segments belongs and a compression ratio range to which the sample compression ratio of each of the data segments belongs, an expected length to divide the data segment into data chunks, where the sample compression ratio of each of the data segments uniquely belongs to one of the compression ratio ranges, and the length of each of the data segments uniquely belongs to one of the length ranges.

In an application of the embodiments of the present invention, a data object is divided into blocks, the blocks are aggregated into a data segment according to a compression ratio of each block, and then the data segment is divided into data chunks, which achieves a result of dividing a data object into data chunks.

BRIEF DESCRIPTION OF DRAWINGS

To describe the technical solutions in the embodiments of the present invention or in the prior art more clearly, the following briefly introduces the accompanying drawings required for describing the embodiments or the prior art. The accompanying drawings in the following description show merely some embodiments of the present invention, and other drawings may still be derived from these accompanying drawings.

DESCRIPTION OF EMBODIMENTS

Figure 1:
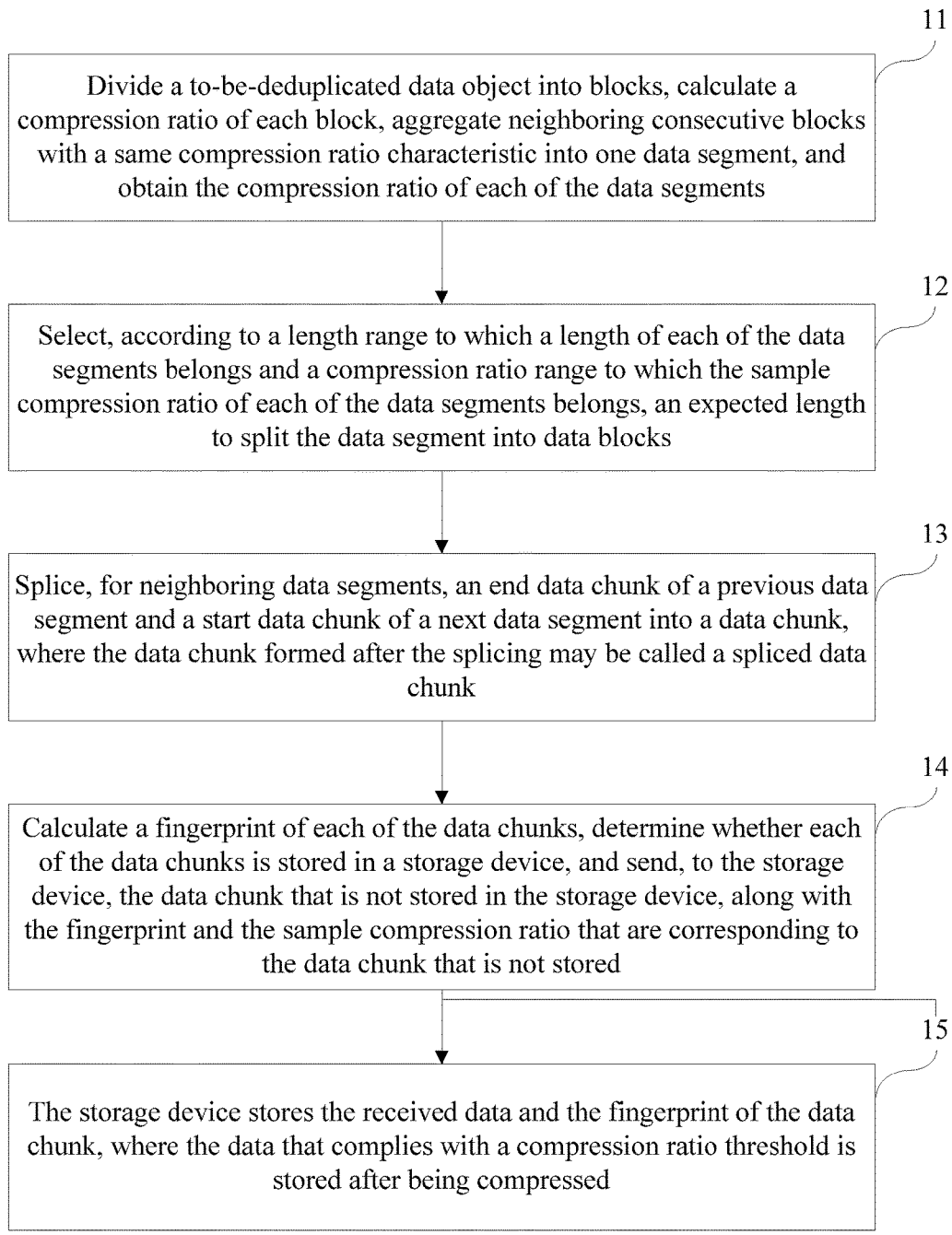
FIG. 1 is a flowchart of an embodiment of a data object processing method.

The following clearly and completely describes the technical solutions of the present invention with reference to the accompanying drawings in the embodiments of the present invention. Apparently, the described embodiments are merely a part rather than all of the embodiments of the present invention. All other embodiments obtained based on the embodiments of the present invention shall fall within the protection scope of the present invention.

Reducing an expected length of a data chunk is conducive to obtaining a higher deduplication rate, but may also increase the number of data chunks and corresponding indexes, thereby increasing the complexity of searching for duplicate data chunks and restricting the deduplication performance.

In the prior art, fine-granularity chunking is adopted in a region of transition between duplicate content and non-duplicate content, whereas coarse-granularity chunking is adopted in other regions, thereby forming a bimodal chunking method. The method, however, requires frequently querying for duplication of candidate chunks in a chunking process, and therefore causes query load pressure to a deduplication storage system. In addition, a chunking result of the method relies on a transmission order of multi-version data, and therefore the method is unstable.

An embodiment of the present invention provides a content defined multimodal data deduplication chunking method, which provides compressibility and can divide a data object into data chunks. Specifically, in an application of the embodiment of the present invention, a data object is divided into blocks, the blocks are aggregated into a data segment according to a sample compression ratio of each block, and then an expected length is selected according to lengths and sample compression ratios of data segments to divide each data segment into data chunks, which achieves a result of dividing a data object into data chunk sequences in multimodal length distribution.

In the embodiment of the present invention, a data object refers to a segment of operable data, for example, a file or a data stream. A chunking policy mapping table is used to maintain a mapping relationship among a compression ratio range, a length range and an expected chunk length, where the expected chunk length of a data segment becomes larger along with the increase of the compression ratio and the length of the data segment.

In the method provided in the embodiment of the present invention, a data object may be divided into data chunks, and the data chunks obtained after the dividing may be used as a unit of data deduplicaion, so that the data object may be stored or transmitted on the premise that storage space utilization is reduced without a data loss. Certainly, a data chunk generated from the dividing may be further used for purposes other than data deduplication. The embodiment of the present invention includes: step (a), input a data object (Data Object) in a chunking device, where the data object may come from a memory outside or inside the chunking device, for example, the data object may be a file or a data stream as long as it meets a deduplication operation requirement, which is not limited in the embodiment of the present invention; step (b), divide the data object into one or more blocks (Blocks), estimate a compression ratio of each block by using a sampling method, query a chunking policy mapping table, and aggregate neighboring consecutive blocks, of which compression ratios belong to a same compression ratio range, into one data segment (Segment), where a sample compression ratio is a measure of compressibility of a data chunk, and the sample compression ratio is the same as the compression ratio of a block when sampling is performed on the entire block; step (c), query the chunking policy mapping table for each data segment, select an expected length according to a compression ratio range and a length range that are corresponding to the data segment, and divide the data segment into chunk (Chunk) sequences according to the selected expected length by using a content defined chunking method; and step (d), splice neighboring chunks that are on different data segments, and calculate a hash value of each chunk for data deduplication, where the splicing step is an optional step and the hash values may be calculated directly without the splicing. In step (b), the data object is divided into data segment sequences again by using sample compression ratio information of a block sequence. There may be a plurality of dividing methods, for example, in another implementation manner: in step (b), reference may not be made to the compression ratio range, and neighboring consecutive blocks, for which a difference between values of the sample compression ratios is less than a specified threshold, into one data segment instead.

Embodiment 1

Referring to FIG. 1, the following uses specific steps to describe in detail a data object processing method according to an embodiment of the present invention.

Step 11: Divide a to-be-deduplicated data object into one or more blocks, calculate a sample compression ratio of each block, aggregate neighboring consecutive blocks with a same compression ratio characteristic into one data segment, and obtain the sample compression ratio of each of the data segments. Each block may be of fixed length or variable length. In a case where a block is of variable length, a random length in a certain range may be selected as the length of the block; or a data object may be scanned to output multiple groups of candidate chunk boundaries with different expected lengths, and one of the multiple groups of candidate chunk boundaries is used to divide the data object into one or more variable-length blocks.

A compression ratio is used to measure a degree to which data can be compressed, and is calculated as that: the compression ratio=a compressed data volume/an original data volume. A method for estimating the compression ratio is: extracting a segment of sample data from each block based on a sampling rate S, compressing the sample data by using a data compression algorithm, for example, a lossless compression algorithm LZ algorithm and RLE encoding, calculating a compression ratio, and using the compression ratio of the sample as the compression ratio of a sampled block. A higher sampling rate means that the compression ratio of a sample is closer to the actual compression ratio of the sampled block.

For a compressible data segment, its compression ratio is generally less than 1; for a incompressible data segment, due to addition of a metadata overhead such as a description field, a length of the data segment after compression coding may be greater than an original data length, which may cause the compression ratio to be greater than 1. A compression ratio entry includes a series of compression ratio ranges, where an intersection between different compression ratio ranges is empty, and a union of all compression ratio ranges constitutes a complete compression ratio value range $[0, \infty)$.

A compression ratio characteristic refers to using the compression ratio as a parameter for aggregating blocks. If the compression ratio or a value obtained from a compression rate operation of a block meets a preset condition, the block complies with the compression ratio characteristic. Specifically, a compression ratio characteristic may be a compression ratio range, namely, a range of a compression ratio, and may also be a threshold of a difference between values of compression ratios of neighboring blocks. Referring to Table 1, the compression ratio range is used as the compression ratio characteristic. A data object is divided into seven blocks: blocks 1 to 7. By performing sampling on each block and estimating their compression ratios, a sample compression ratio of each block is obtained, for example, the sample compression ratio of block 1 is 0.4, and the sample compression ratio of block 2 is 0.42; each sample compression ratio belongs to one compression ratio range, for example, the compression ratio 0.4 belongs to the compression ratio range [0, 0.5), and the compression ratio 0.61 belongs to the compression ratio range [0.5, 0.8). Because each block corresponds to one sample compression ratio, it may also be regarded that each block belongs to one compression ratio range; blocks that belong to the same compression ratio range are aggregated into one data segment, and therefore, block 1 and block 2 may be aggregated into data segment 1, block 3, block 4 and block 5 may be aggregated into data segment 2, and block 6 and block 7 may be aggregated into data segment 3.

TABLE 1

| Block | Sample Compression Ratio | Compression Ratio Range | Data Segment |
| --- | --- | --- | --- |
| Block 1 | 0.4 | [0, 0.5) | Data segment 1 |
| Block 2 | 0.42 | | |
| Block 3 | 0.53 | [0.5, 0.8) | Data segment 2 |
| Block 4 | 0.61 | | |
| Block 5 | 0.79 | | |
| Block 6 | 0.82 | $[0.8, \infty)$ | Data segment 3 |
| Block 7 | 0.89 | | |

Step 12: Select, according to a length range to which a length of each data segment belongs and a compression ratio range to which the sample compression ratio of each data segment belongs, an expected length to divide a data segment into data chunks. A value range of the length of the data segment is classified as at least one of the length ranges, where the length of each of the data segments uniquely belongs to one of the length ranges, and the sample compression ratio of each of the data segments uniquely belongs to one of the compression ratio ranges.

Different compression ratio ranges do not intersect, different length ranges do not intersect, and each combination of the compression ratio range and the length range corresponds to one expected length. The sample compression ratio of each data segment uniquely belongs to one compression ratio range, and the length of each data segment uniquely belongs to one length range. The sample compression ratio of a data segment may be obtained by performing sampling and compression on the data segment; or calculating an average value of the sample compression ratios of the blocks that form the data segment, where the average value may be an arithmetic average; or calculating a weighted average of the sample compression ratios of the blocks based on the length of each block, where a specific method is: calculate the weighted average of the sample compression ratios of the blocks by using the sample compression ratios of the blocks that form the data segment as flag values and the lengths of the blocks as weights.

When dividing a data segment into data chunks, a boundary of a data chunk needs to be found. A data chunk is between neighboring boundaries.

If a method for dividing blocks used in step 11 is: calculating multiple groups of candidate chunk boundaries with different expected lengths, and dividing the data object into one or more variable-length blocks by using one of the multiple groups of candidate chunk boundaries, step 12 may be selecting, according to the selected expected length and from the multiple groups of candidate chunk boundaries, chunk boundaries with the same expected length to divide the data segment into data chunks, that is, selecting corresponding chunk boundaries from the multiple groups of candidate chunk boundaries obtained by scanning in step 11 instead of scanning the data segment again. If another method, for example, a method of using fixed-length blocks, is used in step 11 to divide blocks, step 12 may be selecting an expected length and then finding the boundary of each block by scanning the data segment, to divide the data segment into data chunks. Compared with the method of calculating multiple groups of candidate chunk boundaries with different expected lengths, the later method has one more step of finding the boundaries of the data chunks by scanning the data segment.

Referring to an example in Table 2, a compression ratio value range is divided into three compression ratio ranges: [0, 0.5), [0.5, 0.8) and $[0.8, \infty)$. There is no intersection between the compression ratio ranges, and the sample compression ratio of each data segment belongs to one compression ratio range, which may also be understood that each data segment corresponds to one compression ratio range. In addition, the length value range of a data segment is divided into at least one length range. There is no intersection between length ranges, and therefore each data segment corresponds to one length range. The length range and the compression ratio range jointly determine the expected length of a data segment. For example, if the length range of data segment A is [0 MB, 10 MB), the sample compression ratio of data segment A is within the compression ratio range [0, 0.5), and the expected length jointly determined by the length range [0 MB, 10 MB) and the compression ratio range [0, 0.5) is 32 KB, the expected length of data segment A is 32 KB. Likewise, it can be obtained, according to the length range to which the length of data segment B belongs and the compression ratio range to which the sample compression ratio of data segment B belongs, that the expected length of data segment B is 256 KB. After the expected lengths are obtained, each data segment can be divided into data chunks according to the expected lengths. For example, data segment A is divide into data chunks according to the expected length 32 KB, and data segment B is divide into data chunks according to the expected length 256 KB, where B in KB is short for byte (Byte), 1 KB=1024 Bytes and 1 MB=1024 KB.

Because an expected length is a theoretical value, actual lengths of data chunks may be different, that is, data chunks are of variable length. However, an average chunk length of the data chunks divided from data segment A is close to the expected length 32 KB, and therefore it is of the highest probability that length values of these data chunks of variable length are 32 KB, and 32 KB is also a peak length. In the embodiment of the present invention, each expected length corresponds to one peak length, and therefore the embodiment of the present invention provides a data chunking and deduplication method where multiple peak lengths exist.

TABLE 2

| Data Segment | Compression Ratio Range | Length Range | Expected Length |
|---|---|---|---|
| Data segment A | [0, 0.5) | [0 MB, 10 MB) | 32 KB |
| Data segment B | [0, 0.5) | [10 MB, ∞) | 256 KB |
| Data segment C | [0.5, 0.8) | [0, 10 MB) | 64 KB |
| Data segment D | [0.5, 0.8) | [10 MB, ∞) | 256 KB |
| Data segment E | [0.8, ∞) | [0, 100 MB) | 256 KB |
| Data segment F | [0.8, ∞) | [100 MB, 500 MB) | 2 MB |
| Data segment G | [0.8, ∞) | [500 MB, ∞) | 5 MB |

In this embodiment, an expected length can be obtained by using an empirical value or by means of analytical statistics. As shown in Table 2, an optional rule for determining an expected length is that: if compression ratio ranges are the same, the corresponding expected length increases as a lower limit of the length range increases; and if the length ranges are the same, the corresponding expected length in the mapping table also increases as a lower limit of the compression ratio range increases. An expected chunk length of a data segment is positively correlated with a lower limit of the compression ratio range to which the sample compression ratio of the data segment belongs and the lower limit of the length range to which the length of the data segment belongs. In some cases, a deduplication rate of a large data object and a data object that is difficult to compress is not sensitive to chunking granularity, and a chunking method using the expected length can rapidly reduce the number of chunks without rapidly deteriorating the deduplication rate.

Based on locations of data chunks in a data segment, data chunks divided from the data segment are in an order, where the data chunks in an order form a data chunk sequence, which may also be called a chunking subsequence. Step 12 may also include splicing the chunking subsequences generated by different data chunks from the dividing, to form a chunking sequence of a data object, where the order of the chunks in the chunking sequence is the same as that of chunk data in the data object.

Step 13: Splice, for neighboring data segments, an end data chunk of a previous data segment and a start data chunk of a next data segment into a data chunk, where the data chunk formed after the splicing may be called a spliced data chunk. Step 13 is an optional step. For example, if a boundary of a data segment in step 11 is the boundary of a fixed-length block, step 13 may be used, and the splicing can avoid the boundary of the fixed-length block from being used as the boundary of a chunk, which can achieve a better deduplication effect.

In addition, for a spliced data chunk generated in a region of transition between two data segments, neighboring data chunks on two sides of the spliced data chunk correspond to different expected lengths respectively. Optionally, a smaller value between the two expected lengths may be adopted to divide the spliced data chunk into data chunks of a finer granularity, so that duplicate content in the region of transition between the two data segments can be identified in a better way, which improves the deduplication effect while causing a slight increase in the total number of data chunks. In other embodiments, an expected length that is less than the smaller value between the two expected lengths may also be adopted to divide the spliced data chunk into data chunks of a further finer granularity.

When step 12 includes a step of splicing chunking subsequences, step 13 may be performed before the chunking subsequences are spliced, and may also be performed after the chunking subsequences are spliced.

Step 14: Calculate a fingerprint of each of the data chunks, determine, by using the fingerprint, whether each of the data chunks is stored in a storage device, and send, to the storage device, the data chunk that is not stored in the storage device, along with the fingerprint and the sample compression ratio that are corresponding to the data chunk that is not stored.

A fingerprint is used to uniquely identify a data chunk, and a data chunk and a fingerprint corresponding to the data chunk have a one-to-one correspondence. A fingerprint calculating method is to calculate a hash (Hash) value of a data chunk as a fingerprint.

Step 15: The storage device stores the received data chuck and the fingerprint of the data chunk. During the storing, the storage device may determine whether the sample compression ratio of the received data chunk complies with a compression ratio threshold; and compresses and then store the data chunk that complies with the compression ratio threshold, so as to save storage space, and directly stores data that does not comply with the compression ratio threshold without compressing the data. For example, if the compression ratio threshold is less than or equal to 0.7, a data chunk whose sample compression ratio is less than or equal to 0.7 may be stored after being compressed, and data chunk whose sample compression ratio is greater than 0.7 is directly stored without being compressed.

It should be noted that more than one segmentation manner can be used in step 11. For example, in another implementation manner, a segmentation policy used in step 11 may be modified as: aggregating neighboring consecutive blocks, for which a difference between values of sample compression ratios is less than a specified threshold, into one data segment. In other words, that the difference between the values of sample compression ratios is less than a specified threshold is a compression ratio characteristic. Table 1 is still used as an example, where it is assumed that the difference between the values of sample compression ratios that is less than 0.1 is used as the threshold. Then 0.42−0.4<0.1, and therefore block 1 and block 2 are placed into one data segment; and 0.53−0.42>0.1, and therefore block 3 and block 2 are not placed into one data segment. By analog, block 1 and block 2 are placed into a first data segment, block 3 and block 4 are placed into a second data segment, and block 5, block 6 and block 7 are placed into a third data segment.

Embodiment 2

Figure 2:
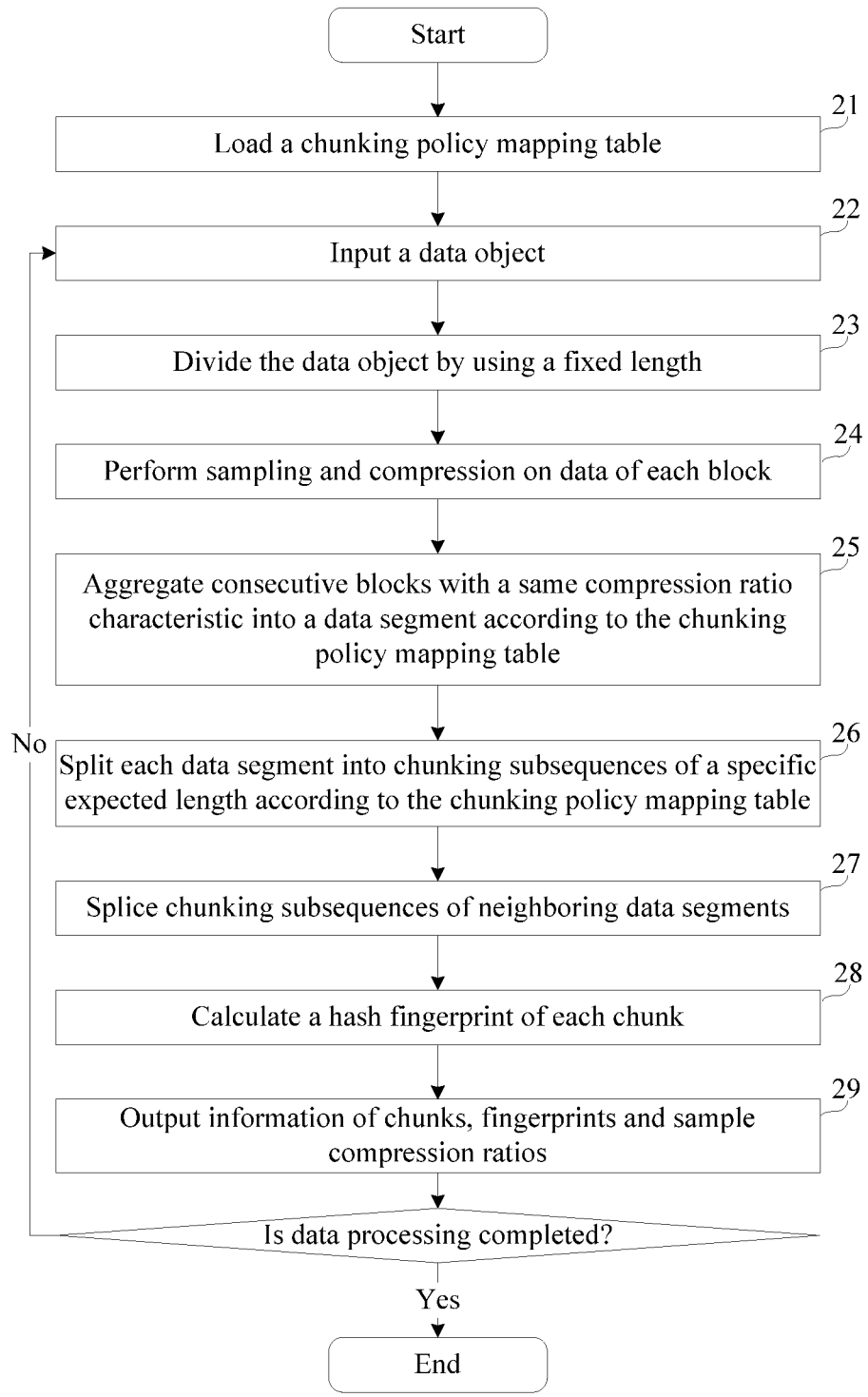
FIG. 2 is a flowchart of an embodiment of a data object processing method.

As shown in FIG. 2, Embodiment 2 is described in detail and a data object processing method according to this embodiment includes the following steps.

21: Load a chunking policy mapping table. Referring to Table 1 and Table 2, the chunking policy mapping table records which compression ratios have a same compression ratio characteristic; in addition, the chunking policy mapping table further records a length range to which a length of a data segment belongs, a compression ratio range to which a compression ratio of a data segment belongs, and an expected length jointly determined by the length range and the compression ratio range. The expected length is used to divide the data segment into data chunks. The step may also be performed subsequently, as long as the chunking policy mapping table is loaded before it needs to be used.

22: Input a data object that needs to be processed in an apparatus for implementing the method. In other words, obtain a data object that needs to be processed, where a source of obtaining the data object may be the apparatus for implementing the method, and may also be an external apparatus connected to the apparatus for implementing the method.

23: Divide the data object by using a fixed length. In a specific implementation, in the step, the data object needs to be scanned to obtain a boundary of each fixed-length block, where data between two neighboring boundaries is a block.

24: Perform sampling and compression on data of each block, and use a compression ratio obtained by the sampling and compression as a data sample compression ratio of the entire block.

25: Aggregate consecutive blocks with a same compression ratio characteristic into a data segment according to the chunking policy mapping table.

26: Divide each data segment into data chunks of a specific expected length according to the chunking policy mapping table. In a specific implementation, in the step, each data segment needs to be scanned to find boundaries of data chunks, and the data segment is divided by using the boundaries to form a series of data chunks.

In this embodiment, after step 26 is performed, processing of a data object is completed and an effect of dividing the data object into data chunks is achieved. Subsequent steps 27, 28 and 29 are further extensions to the data object processing method.

27: Splice chunking subsequences generated by each data segment. Data chunks formed by dividing each data segment are in an order, which is the same as locations of the data chunks in the data segment, and the data chunks in an order may also be called chunking subsequences. In the step, a splicing manner is: for any two neighboring data segments, splicing an end data chunk of a previous data segment and a start data chunk of a next data segment into a data chunk, so as to eliminate a boundary between data segments, combine multiple chunking subsequences, and form data chunk sequences of the entire data object; optionally, a data chunk spliced in the step may be divided into data chunks of a finer granularity, which improves an deduplication effect. Another splicing manner is: while keeping each data chunk unchanged, sorting, according to an order of the data segments in the data object, where the start data chunk of a next data segment is preceded by the end data chunk of the previous data segment, chunking subsequences of each data segment to form the data chunk sequences of the entire data object.

28: Calculate hash values of chunks as fingerprints.

29: Output the chunks and the fingerprints of each chunks, and optionally, the sample compression ratios of each chunks may also be output. The sample compression ratios of the chunks may be obtained through calculating by using the sample compression ratio of the segment to which the chunks belong, and one manner is directly using the sample compression ratio of the segment as the sample compression ratio of the chunks in the segment.

When there is more than one data object, repeat steps 22 to 29 until all data objects are processed.

A specific method for implementing the foregoing steps is: scanning a data object by using a w-bytes sliding window, and recalculating a fingerprint f(w-bytes) of data within the window by adopting a rapid hash algorithm in each 1-byte forward sliding; if the expected length of the current data segment is E, determining whether the current fingerprint meets a chunk boundary filter criterion based on whether an expression Match(f(w-bytes), E)=D holds, where an integer D∈[0, E) is a predefined eigenvalue and a function Match(•) is used to map f(w-bytes) to a range [0, E). Because a hash function f(•) is random, the filter criterion can output a series of chunks whose peak length is E. When the process reaches a new data segment, the expected length E of the new data segment changes, and therefore a chunking subsequence of a new peak length is output. When performing chunking on a neighboring region of two data segments, a former boundary of a data chunk is determined by an expected length of a previous data segment, and a latter boundary is determined by an expected length of a next data segment, and therefore, the former and latter boundaries of the data chunk are within the two segments respectively, which is equivalent to that the chunking subsequences between the neighboring segments are spliced automatically, so that the process does not use a segment boundary as a chunk boundary.

Figure 3:
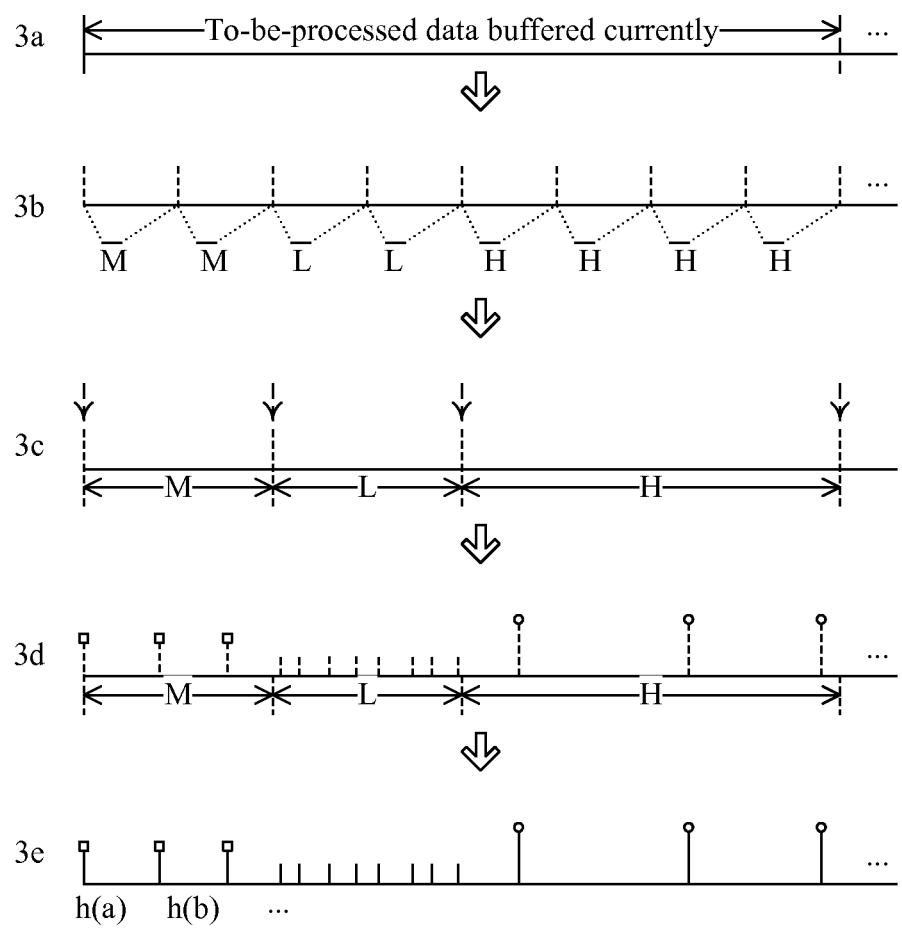
FIG. 3 is a flowchart of an embodiment of a data object processing method.

For ease of understanding, Embodiment 2 further provides flowchart shown in FIG. 3, where the step process successively is: 3a, input a data object on which a data object processing method needs to be performed, where the data object may be temporarily stored in a buffer before the data object processing is performed on the data object; 3b, perform block division, sampling, and compression ratio estimation on the data object, where L, M and H represent three different compression ratio ranges respectively; 3c, aggregate consecutive blocks with a same compression ratio characteristic into a data segment; 3d, select an expected length according to the compression ratio and length characteristic of each data segment and calculate a chunk boundary and divide each data segment into data chunks according to the calculated chunk boundary, where data chunks divided from each data segment form a chunking subsequence; and 3e, splice the chunking subsequences of the data segments and calculate a chunking fingerprint.

Embodiment 3

In Embodiment 2, a to-be-deduplicated data object is divided into multiple fixed-length blocks. However, in Embodiment 3, pre-chunking is performed on the to-be-deduplicated data object by using an expected length. Specifically, a data object (a file/data stream) is scanned by using a content defined chunking method and multiple groups of candidate chunk boundaries with different expected lengths are generated, where each group of candidate chunk boundary corresponds to one candidate chunking sequence of the data object, and a chunking sequence may also be understood as a chunking solution in the afterthereof. One of the pre-chunking solutions is used to divide a data object into blocks, where sampling and compression is performed on the blocks and a method for dividing data segments is determined, and in a subsequent step of dividing the data segment into data chunks, a corresponding candidate chunk boundary is selected to divide the data chunk according to the expected length.

Therefore, in Embodiment 2, a data object needs to be scanned when the data object is divided into blocks and when a data segment is divided into data chunks. In this embodiment, a data object needs to be scanned for only once, thereby saving a system resource and improving the processing efficiency of the data object. In addition, because a boundary of either a block and or a data chunk in Embodiment 3 is based on a candidate chunk boundary, a segment boundary generated by block aggregation has no adverse effect on deduplication, which means that there is no need to perform an operation to eliminate the segment boundary for a data chunk, and in other words, there is no need to splice, for neighboring data segments, an end data chunk of a previous data segment and a start data chunk of a next data segment to form a data chunk.

A smaller expected length means a finer average chunking granularity and is more conducive to perceiving a change of partial compression ratio of data content; and a larger expected length means a coarser average chunking granularity.

Figure 4:
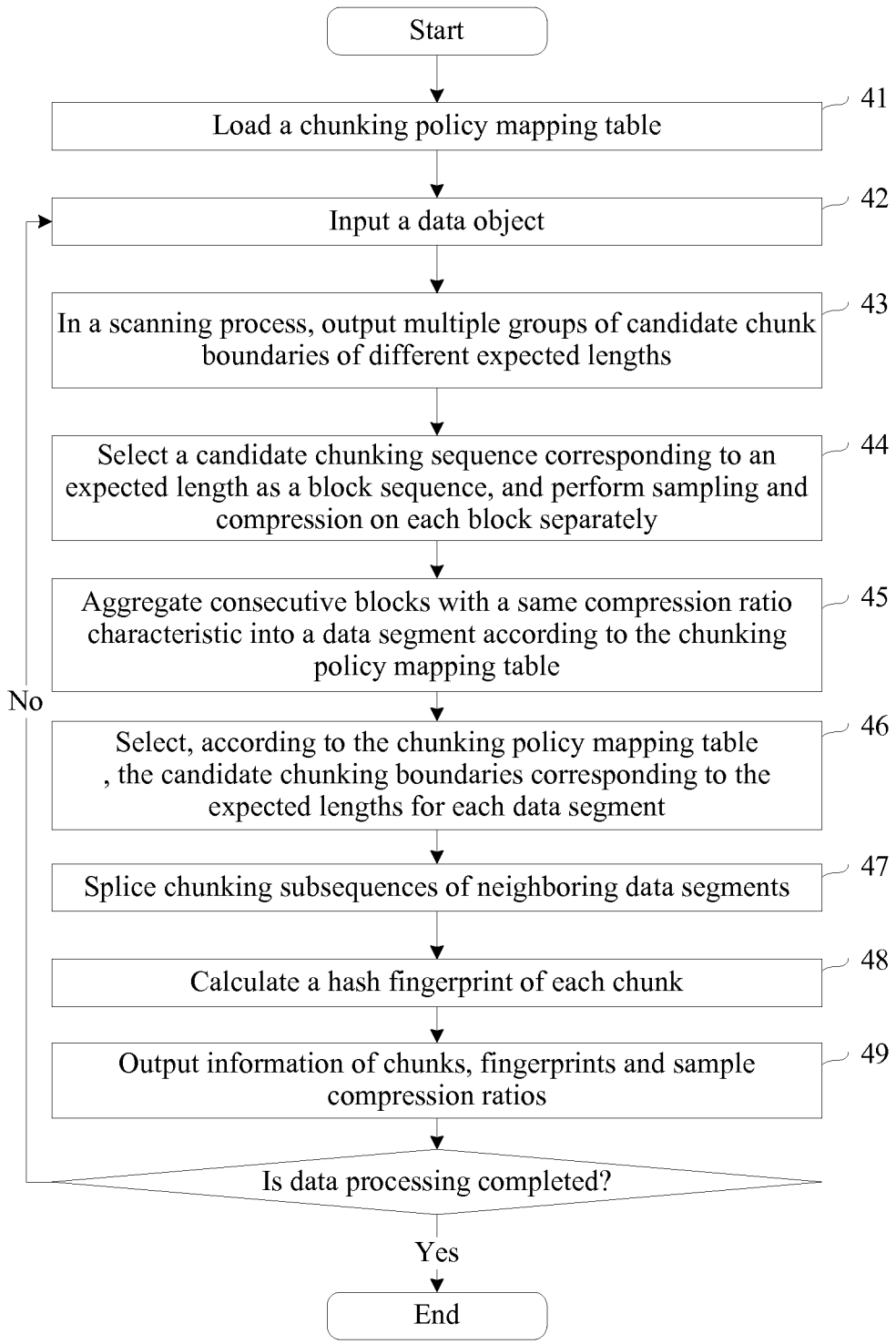
FIG. 4 is a flowchart of an embodiment of a data object processing method.

As shown in FIG. 4, the data object processing method provided in this embodiment may specifically include the following steps:

41: Load a chunking policy mapping table. Referring to Table 1 and Table 2, the chunking policy mapping table records which compression ratios belong to a same compression ratio characteristic; in addition, the chunking policy mapping table further records a length range to which a length of a data segment belongs, a compression ratio range to which a compression ratio of a data segment belongs, and an expected length jointly determined by the length range and the compression ratio range, where the expected length is used to divide the data segment into data chunks. The step may also be performed subsequently, as long as the chunking policy mapping table is loaded before it needs to be used.

42: Input a data object that needs to be processed in an apparatus for implementing the method. In other words, obtain a data object that needs to be processed, where a source of obtaining the data object may be the apparatus for implementing the method, and may also be an external apparatus connected to the apparatus for implementing the method.

43: In a scanning process, output multiple groups of candidate chunk boundaries, where each group of candidate chunk boundaries and an expected length has a one-to-one correspondence. These expected lengths include the expected lengths corresponding to the data segments in subsequent steps.

44: Select one group of candidate chunk boundaries from the multiple groups of candidate chunk boundaries in step 43, and perform sampling and compression on a candidate chunking sequence formed by the selected group of candidate boundaries. The step is to divide the data object into blocks, where the expected length of a block is one of the multiple expected lengths used in step 43. When block division is performed according to the expected length, the data object does not need to be scanned again but is directly divided into blocks according to candidate chunk boundaries corresponding to the expected length. Then, perform sampling and compression on data of each block, and use a compression ratio obtained by the sampling and compression as a sample compression ratio of the entire block data.

45: Aggregate consecutive blocks with a same compression ratio characteristic into a data segment according to the chunking policy mapping table.

46: Select, according to the chunking policy mapping table, the candidate chunk boundaries corresponding to the expected lengths for each data segment. A boundary of a data chunk determines a length and location of the data chunk, and therefore, the step is dividing a data segment into data chunks. As described above, the candidate chunk boundaries in step 46 come from step 43, so that the data object does not need to be scanned again when a data segment is divided into data chunks, thereby saving a system resource.

In this embodiment, after step 46 is performed, processing of a data object is completed and an effect of dividing the data object into data chunks is achieved. Subsequent steps 47, 48 and 49 are further extensions to the data object processing method.

47: Splice chunking subsequences of neighboring data segments. Sort the subsequences of each data segment according to an order of the data segments in the data object to form a data chunking sequence of the data object. A data chunk may also be called a chunk.

48: Calculate hash values of data chunks as fingerprints.

49: Output the chunks and the fingerprints of the chunks, and optionally, the sample compression ratios of the chunks may also be output. The sample compression ratios of the chunks may be obtained through calculating by using the sample compression ratio of the segment to which the chunks belong, and one manner is directly using the sample compression ratio of the segment as the sample compression ratio of the chunks in the segment.

When storing a data chunk, determine, according to the sample compression ratio of the chunk, whether the data chunk needs to be compressed before being stored.

When data processing is not completed, that is, when there is more than one data object, steps 42 to 49 are performed successively on remaining objects until all data objects are processed.

A specific method for implementing the foregoing step 43 is: in the process, constructing all expected lengths $E_i$ and corresponding eigenvalues $D_i$ in the chunking policy mapping table shown in Table 2 into a parameter list, and determining, by successively using a different parameter $<E_i, D_i>$, whether each fingerprint f(w-bytes) output by a sliding window meets a match condition Match(f(w-bytes), $E_i$)=$D_i$, and if a fingerprint meets the match condition, a candidate chunk boundary corresponding to a current window $E_i$ is selected. The fingerprint matching efficiency can be improved by optimizing the parameter $<E_i, D_i>$. For example, when Match(f(w-bytes), $E_i$)=f(w-bytes) mod $E_i$ is defined, and $E_0=2^{12}$ B=4 KB, $E_1=2^{15}$ B=32 KB, $D_0=D_1=0$ are selected, if f(w-bytes) mod $E_0 \neq D_0$, f(w-bytes) mod $E_1 \neq D_1$ occurs definitely. That is, if one fingerprint does not meet a filter criterion corresponding to an expected length 4 KB, there is no need to continue checking whether the fingerprint meets a filter criterion corresponding to an expected length 32 KB.

Figure 5:
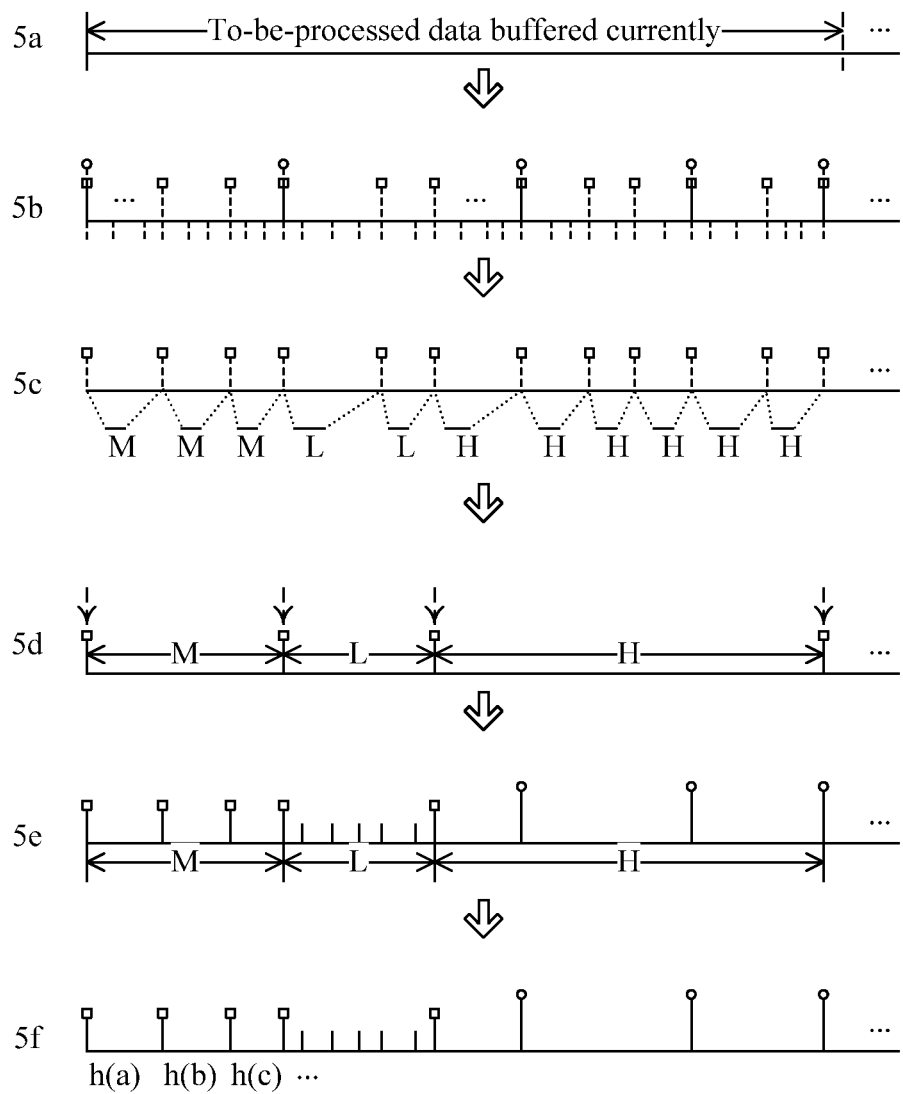
FIG. 5 is a flowchart of an embodiment of a data object processing method.

For ease of understanding, Embodiment 3 further provides flowchart shown in FIG. 5. Steps in FIG. 5 are: 5a, output a data object on which a data object processing method needs to be performed, where the data object may be temporarily stored in a buffer before the data object processing is performed on the data object; 5b, determine multiple groups of candidate chunk boundaries by using different expected lengths; 5c, select, among the multiple groups of candidate chunk boundaries determined in 5b, a group of candidate chunking sequence to divide the data object and perform sampling and compression ratio estimation on the chunks obtained after the division; 5d, aggregate consecutive candidate blocks with a same compression ratio characteristic into a data segment; 5e, select an expected length and a corresponding chunk boundary according to the compression ratio and length characteristic of each data segment, where the data chunks divided from each data segment according to the corresponding chunk boundary form a chunking subsequence; and 5f, splice chunking subsequences of the data segments and calculate a chunking fingerprint.

Embodiment 4

Figure 6:
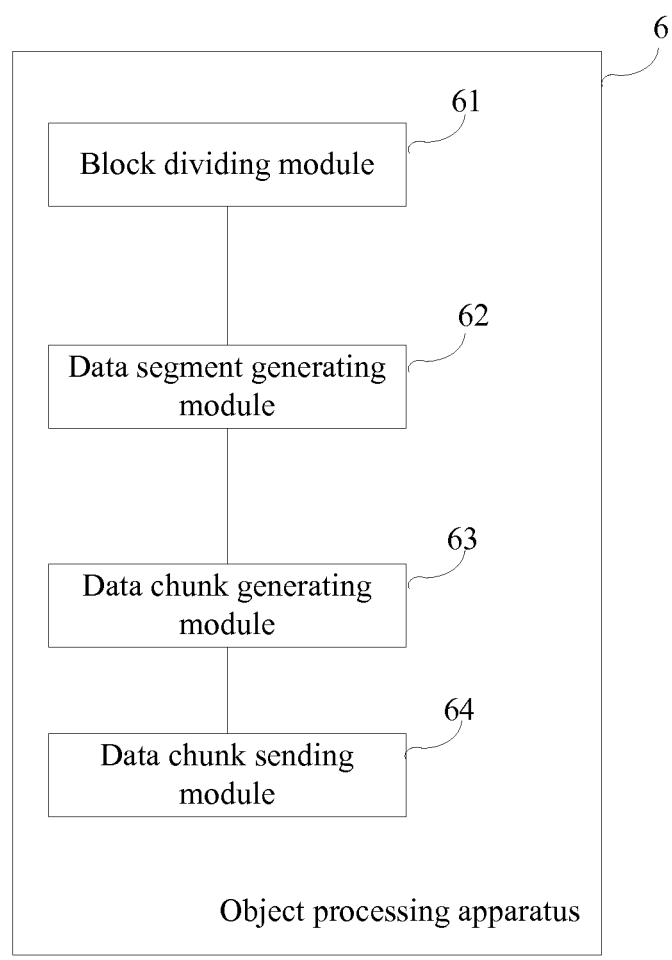
FIG. 6 is a flowchart of an embodiment of a data object processing apparatus.

Referring to FIG. 6, this embodiment describes a data object processing apparatus 6, to which the methods provided in Embodiment 1, Embodiment 2 and Embodiment 3 are applied. The data object processing apparatus 6 includes: a block dividing module 61, a data segment generating module 62, and a data chunk generating module 63.

In the data object processing apparatus 6, the block dividing module 61 is configured to divide a data object into one or more blocks; the data segment generating module 62 is configured to calculate a sample compression ratio of each block, aggregate consecutive blocks with a same sample compression ratio characteristic into one data segment, and obtain the sample compression ratio of each data segment; and the data chunk generating module 63 is configured to select, according to a length range to which a length of each of the data segments belongs and a compression ratio range to which the sample compression ratio of each of the data segments belongs, an expected length to divide the data segment into data chunks, where the sample compression ratio of each of the data segments uniquely belongs to one of the compression ratio ranges, and the length of each of the data segments uniquely belongs to one of the length ranges.

Specifically, the block dividing module 61 may be configured to divide the data object into one or more fixed-length blocks; and may also be configured to calculate multiple groups of candidate chunk boundaries with different expected lengths, and divide the data object into one or more variable-length blocks by using one of the multiple groups of candidate chunk boundaries.

The data segment generating module 62 is specifically configured to calculate the sample compression ratio of each block, aggregate neighboring consecutive blocks, of which the sample compression ratios belong to the same compression ratio range, into one data segment, and obtain the sample compression ratio of each of the data segments.

The data segment generating module 62 is further specifically configured to calculate the sample compression ratio of each block, aggregate neighboring consecutive blocks, for which a difference between values of the sample compression ratios is less than a specified threshold, into one data segment, and obtain the sample compression ratio of each of the data segments.

In various possible implementation solutions of the data object processing apparatus 6, a function of the data chunk generating module 63: selecting an expected length to divide a data segment into data chunks may specifically be: selecting, according to the selected expected length and from the multiple groups of candidate chunk boundaries calculated by the block dividing module, the chunk boundaries with the same expected length to divide the data segment into data chunks.

The data chunk generating module 63 may further be configured to: splice, for neighboring data segments, an end data chunk of a previous data segment and a start data chunk of a next data segment into a spliced data chunk. Further, the data chunk generating module 63 may further be configured to divide the spliced data chunk into multiple data chunks, where the expected length used for dividing is less than or equal to an expected length corresponding to the previous data segment, and the expected length used for the dividing is less than or equal to an expected length corresponding to the next data segment.

In addition, the data object processing apparatus 6 may further include a data chunk sending module 64. The data chunk sending module 64 is configured to: calculate a fingerprint of each of the data chunks, determine, by using the fingerprint, whether each of the data chunks is stored in a storage device, and send, to the storage device, the data chunk that is not stored in the storage device, along with the fingerprint and the sample compression ratio that are corresponding to the data chunk that is not stored. The storage device stores the fingerprint of the received data chunk, determines whether the sample compression ratio of the received data chunk complies with a compression ratio threshold, and compresses and then stores the data chunk that complies with the compression ratio threshold.

The data object processing apparatus 6 may also be regarded as a device formed by a CPU and a memory, where the memory stores programs and the CPU performs the methods provided in Embodiment 1, Embodiment 2 and Embodiment 3 according to the programs in the memory. The data object processing apparatus 6 may further include an interface, where the interface is used to connect to a storage device. For example, a function of the interface may be sending, to the storage device, a data chunk generated after being processed by the CPU.

Based on the foregoing descriptions of the embodiments, a person skilled in the art may clearly understand that the present invention may be implemented by software in addition to necessary universal hardware or by hardware only. In most circumstances, the former is a preferred implementation manner. Based on such an understanding, the technical solutions of the present invention essentially or the part contributing to the prior art may be implemented in a form of a software product. The computer software product is stored in a readable storage medium, such as a floppy disk, a hard disk or an optical disc of a computer, and includes several instructions for instructing a computer device (which may be a personal computer, a server, a network device, or the like) to perform the methods described in the embodiments of the present invention.

The foregoing specific implementation manners describe the objectives, technical solutions, and beneficial effects of the present invention in detail, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A computer-implemented method comprising:
    loading a chunking policy mapping table that records a mapping relationship between a compression ratio range, a length range and an expected chunk length for data segments;
    dividing a data object into a plurality of blocks;
    calculating a respective compression ratio for each of the plurality of blocks;
    aggregating consecutive blocks having a compression ratio characteristic that belongs to a particular compression ratio range recorded in the chunking policy mapping table into a data segment to form one or more data segments, wherein each data segment is formed of one or more blocks;
    determining, based on a query of the chunking policy mapping table, a respective chunk length for each of the data segments according to a compression ratio range recorded in the chunking policy mapping table to which a compression ratio of the data segment belongs and a length range recorded in the chunking policy mapping table to which a length of the data segment belongs; and
    dividing each of the data segments into one or more respective chunks based on the chunk length determined for the data segment.

2. The method according to claim 1, wherein dividing the data object comprises:
    dividing the data object into a plurality of fixed-length blocks.

3. The method according to claim 1, wherein there are a plurality of data segments, and wherein the method further comprises:
    splicing, for one or more pairs of previous and next neighboring data segments, an end data chunk of the previous data segment and a start data chunk of the next data segment into a spliced data chunk.

4. The method according to claim 3, wherein the method further comprises:
    dividing, according to a second chunk length, a first spliced data chunk that joins a previous data segment with a next data segment into at least one second data chunk, wherein the second chunk length is less than or equal to the chunk length of the previous data segment, and is less than or equal to the chunk length of the next data segment.

5. The method according to claim 1, wherein dividing the data object comprises:
    dividing the data object into a plurality of variable-length blocks.

6. The method according to claim 1, wherein dividing each of the data segments into one or more respective chunks comprises:
    dividing the data segment into one or more chunks each having the chunk length determined for the data segment.

7. The method according to claim 1, further comprising:
    calculating a fingerprint of one or more first chunks of a first data segment;
    determining, based on the fingerprint, whether the first chunks are stored in a storage device, and when the first chunks are not stored in the storage device, sending, to the storage device the first chunks along with the fingerprint and the compression ratio of the first chunks; and
    storing, by the storage device, the fingerprint when the compression ratio of the first chunks complies with a compression ratio threshold, and compressing and then storing the first chunks.

8. The method according to claim 7, wherein the compression ratio of the first data segment is used as a chunk compression ratio of the one or more chunks.

9. An apparatus comprising:
    a memory storing instructions; and
    one or more processors in communication with the memory, wherein the one or more processors execute the instructions to:
    load a chunking policy mapping table that records a mapping relationship between a compression ratio range, a length range and an expected chunk length for data segments;
    divide a data object into a plurality of blocks;
    calculate a respective compression ratio for each of the plurality of blocks;
    aggregate consecutive blocks having a compression ratio characteristic that belongs to a particular compression ratio range recorded in the chunking policy mapping table into a data segment to form one or more data segments, wherein each data segment is formed of one or more blocks;
    determine, based on a query of the chunking policy mapping table, a respective chunk length for each of the data segments according to a compression ratio range recorded in the chunking policy mapping table to which a compression ratio of the data segment belongs and a length range recorded in the chunking policy mapping table to which a length of the data segment belongs; and
    divide each of the data segments into one or more respective chunks based on the chunk length determined for the segment.

10. The apparatus according to claim 9, wherein the instructions to divide the data object comprise instructions to:
    divide the data object into a plurality of fixed-length blocks.

11. The apparatus according to claim 9, wherein there are a plurality of data segments, and wherein the one or more processors execute the instructions to:
    splice, for one or more pairs of previous and next neighboring data segments, an end data chunk of the previous data segment and a start data chunk of the next data segment into a spliced data chunk.

12. The apparatus according to claim 11, wherein the one or more processors execute the instructions to:
    divide, according to a second chunk length, a first spliced data chunk that joins a previous data segment with a next data segment into at least one second data chunk, wherein the second chunk length is less than or equal to the chunk length of the previous data segment, and is less than or equal to the chunk length of the next data segment.

13. The apparatus according to claim 9, wherein the instructions to divide the data object comprise instructions to:
   divide the data object into a plurality of variable-length blocks.

14. The apparatus according to claim 9, wherein the instructions to divide each of the data segments into one or more chunks comprise instructions to:
   divide the particular data segment into one or more chunks each having the chunk length determined for the data segment.

15. The apparatus according to claim 9, wherein the one or more processors execute instructions to:
   calculate a fingerprint of one or more first chunks of a first data segment;
   determine, based on the fingerprint, whether the first chunks are stored in a storage device, and when the first chunks are not stored in the storage device, sending, to the storage device the first chunks along with the fingerprint and the compression ratio of the first chunks; and
   store, by the storage device, the fingerprint when the compression ratio of the first chunks complies with a compression ratio threshold, and compressing and then storing the first chunks.

16. The apparatus according to claim 15, wherein the compression ratio of the first data segment is used as a chunk compression ratio of the one or more chunks.

* * * * *